United States Patent
Torii et al.

(10) Patent No.: US 6,667,199 B2
(45) Date of Patent: Dec. 23, 2003

(54) SEMICONDUCTOR DEVICE HAVING A REPLACEMENT GATE TYPE FIELD EFFECT TRANSISTOR AND ITS MANUFACTURING METHOD

(75) Inventors: Kazuyoshi Torii, Kodaira (JP); Ryuta Tsuchiya, Kokubunji (JP); Masatada Horiuchi, Koganei (JP); Takahiro Onai, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/081,227

(22) Filed: Feb. 25, 2002

(65) Prior Publication Data

US 2003/0022422 A1 Jan. 30, 2003

(30) Foreign Application Priority Data

Jul. 27, 2001 (JP) .................................. 2001-227290

(51) Int. Cl.[7] ............................................. H01L 21/338
(52) U.S. Cl. ................... 438/183; 438/287; 438/303; 438/595; 438/591
(58) Field of Search ............................... 438/182, 183, 438/197, 296, 299, 301, 303, 305, 306, 307, 585, 595, 287, 591

(56) References Cited

U.S. PATENT DOCUMENTS 5,960,270 A   9/1999  Misra et al.

6,054,355 A * 4/2000 Inumiya et al. ............. 438/296

FOREIGN PATENT DOCUMENTS

JP    11-135774    5/1999
JP    2001-15746   1/2001

OTHER PUBLICATIONS

D.A. Buchanan et al, "80nm Poly–Silicon Gated n–FETs with Ultra –Thin AL2O3 Gate Dielectric for ULSI Application", IEEE, IEDM Tech. Digest, 2000.
W. Qi, et al, "MOSCAP and MOSFET Characteristics using ZrO2 Gate Dielectric Deposited Directly on Si", IEEE, IEDM Tech. Digest, 1999.
L. Kang et al, "Single–Layer Thin HfO2 gate Dielectric with n+ Polysilicon Gate", 2000 Symposium on VLSI Technology Digest of Techinical Papers, 2000.

* cited by examiner

*Primary Examiner*—Jack Chen
(74) *Attorney, Agent, or Firm*—Mattingly, Stanger & Malur, P.C.

(57) ABSTRACT

The present invention provides a MISFET with a replacement gate electrode, which ensures large ON-current.

A semiconductor device, in which on the substrate, first and second field effect transistors are formed, the first field effect transistor is a replacement gate type field effect transistor, and the length of the overlap between a gate electrode and a source/drain diffusion zone of the first field effect transistor correspond to that between a gate electrode and a source/drain diffusion zone of the second field effect transistor.

3 Claims, 13 Drawing Sheets

SEMICONDUCTOR DEVICE HAVING A REPLACEMENT GATE TYPE FIELD EFFECT TRANSISTOR AND ITS MANUFACTURING METHOD

BACKGROUND OF THE INVENTION

The present invention relates to a semiconductor device and its manufacturing method and especially, relates to the semiconductor having a field effect transistor and its manufacturing method.

An integrated-circuit fabrication technology using silicone continues making progress at a tremendous speed. The advancement of a micro-fabrication technology has reduced element sizes and enabled the integration of an additional number of elements onto one chip, resulting in an increase in functionality. At the same time, the advanced element micro-fabrication technology has improved their current driving performance while reducing load capacity, achieving higher processing speeds.

As the element sizes have increasingly became small, the thickness of the gate insulating film has been also made thinner. Although the sizes of entire elements may be further made smaller, the thickness of the insulating film made of silicone dioxide, which is the material used for conventional films, virtually has been reduced to its critical limit. The thickness of the thinnest one of existing silicone-dioxide gate insulating films is about 2 nm and making the silicone-dioxide films further thinner may cause a direct tunnel effect, leading to a large leak current. The presence of a large leak current not only increases power consumption but also decrease the number of charges induced in the reverse layer of a channel, which in turn, deteriorates the element's current driving performance. Moreover, since such a thin silicone dioxide film has lower competency for a diffusion barrier against impurities, a leak of an impurity may occur out of an electrode. Furthermore, since this type of thin silicone dioxide film is formed by multiple atom layers, precise control is critical to mass-manufacture the films with high homogeneity.

Consequently, to ensure that further thinner elements with higher-speed processing performance are realized, "high-K material", which provides the same higher level of field effect performance as that of the silicone dioxide even if the films made of them are thicker than the silicone dioxide film, have been proactively developed. Potential candidates for them include IV-group oxides such as zirconia and hafnia, III-group oxides such as alumina and yttria, and cilicates, which are solid solutions of silicone dioxide and any of these metals. IV-group and III-group oxides were used for gate insulating films of Si semiconductors at the early stage. However, after the fabrication technology for gate insulating films using silicone dioxide was established, because of its excellent properties, the silicone dioxide material has been exclusively used. Recently, the examples of semiconductors made of silicone dioxide have been reported; the field effect transistor, which uses zirconia for the gate insulating film, is described in IEDM'99 Tech. Digest pp.145, IEEE, 1999, the field effect transistor, which uses hafnia for the gate insulating film, is descried in 2000 Symposium on VLSI Technology Digest of Technical Papers, and the field effect transistor, which uses alumina for the gate insulating film, is described in IEDM'00 Tech. Digest pp.223, 2000. The method for fabricating metallosilicate is described in, for example, the Official Gazette of JP-A No. H11-135774.

Among them, the materials other than alumina cannot endure high-temperature heat treatment such as activating heat treatment because problems may occur including deterioration in withstand voltage due to a crystallized insulating film, reaction between the gate insulating film and the gate electrode, and a low-dielectric constant layer created on the interface of a Si substrate gate insulating film. Moreover, for the structure, in which a high-dielectric constant gate insulating film and a metal gate electrode are combined, such a problem occurs that the metal electrode has poor heat resistance. One of methods for solving the problem of deterioration due to high-temperature heat treatment is to use a replacement gate process. The replacement gate process is described in, for example, the U.S. Pat. No. 5,960,270. Especially, after a gate electrode pattern is formed in the same manner as a process for manufacturing an ordinary MOSFET, the gate pattern is used as a mask for self-coherent ion plantation of impurities and activating heat treatment to form a diffusion zone. This gate electrode is referred to as a dummy gate because it is peeled off later. By this method, after an interlayer dielectric is formed around the dummy gate, the dummy gate is peeled off to form a groove, a gate insulating film is deposited on the inner wall of the groove, and a metal material is embedded to form the gate electrode. The use of this method can drop the temperatures in the heat treatment process after gate electrode formation.

In addition, in the Official Gazette of JP-A No. 2001-15746", the method for fabricating the semiconductor device is described, by which a double sidewall consisting of an oxide film and a nitride film is deposited on the sidewall of the dummy gate, the oxide film and the dummy gate insulting film are peeled off from the sidewall, and then a high-dielectric constant gate insulating film is deposited. Even if this method is used, finally the groove gets thick by the thickness of the oxide film on the sidewall.

As the micro-fabrication technology for transistors has advanced, a junction depth must be reduced to suppress the short channel effect. For example, when a gate length reaches 100–50 nm, the junction depth should be reduced to about 30 nm. Since the horizontal enlarged area of an extension is as large as 0.6–0.7 times the junction depth, the overlap between the gate electrode and a source drain is made small accordingly. However, as shown in FIG. 23, a problem may occur that an ON-state drain electric current (ON-current) suddenly decreases when the overlap is reduced to 20 nm or smaller. On the other hand, a too large overlap may cause such problems that since the area, to which a large electric field is applied, is enlarged in OFF state, an OFF current becomes large and the short channel effect is made more severe. To solve the problems, it is required that the junction depth and the overlap length be precisely controlled for micro transistors.

Besides, when the gate insulating film is deposited using the replacement gate process, the insulating film is deposited not only at the bottom but also on the sidewall of the groove. Accordingly, as shown in FIG. 24, the source/drain extension has an offset distance from the gate electrode equal to the thickness of the gate insulating film. If any high-k material is used for the gate insulating film, the ON-current is made small due to a decrease in overlap length because the thickness of the film is about 3–10 nm.

The conventional art described in the above-mentioned Official Gazette of JP-A No. 2001-15746 is intended to protect the sidewall covered with the cap nitride film when the sidewall oxide film and the cap nitride film are peeled off, and not to control the overlap between the source/drain extension and the gate electrode. This means that the conventional art has no technological concept, on which the overlap between the source/drain extension and the gate electrode is controlled. Therefore, in the conventional art, there is no technological concept cannot be found that the thickness of the sidewall oxide film and the thickness of the high-dielectric constant gate insulating film are made almost equal.

An object of the present invention is to provide a semiconductor device, which is a MISFET with a replacement gate electrode, ensuring a large ON-current.

Another objective of the present invention is to provide a method for manufacturing the semiconductor, which can regulate the overlap length of the ISFET with a replacement gate electrode to control a decrease in ON-current.

SUMMARY OF THE INVENTION

In order to achieve the above-mentioned objectives, the semiconductor of the present invention is so structured that it has a replacement-gate type of field effect transistor and the length of the overlap between the gate electrode of the field effect transistor and the source/drain diffusion zone is 20 nm or more and 5 nm or more shorter than one half of a channel length.

Further, in order to achieve the above-mentioned objectives, the semiconductor of the present invention is so structured that it has the field effect transistor comprising the gate insulating film deposited on the semiconductor substrate and the gate electrode disposed at the gate insulating film, the insulating film deposited on the side wall of the gate electrode is connected to the gate insulating film to be made from the same material, and the length of the overlap between the gate electrode and the source/drain diffusion zone is 20 nm or more and 5 nm or more shorter than one half of the channel length.

For these semiconductors, high-dielectric constant gate insulating film is preferably used to the gate insulating film.

Further, in order to achieve the above-mentioned objectives, the semiconductor of the present invention is so structured that it has a first field effect transistor and a second field effect transistor disposed on the semiconductor substrate, on the sidewall of the gate electrode of the first field transistor, a first insulating film connecting to the gate insulating film and made of the same material as that for the gate insulating film is deposited, on the sidewall of the gate electrode of the second field effect transistor, the second insulating film is disposed to make the thickness of the first insulating film and the thickness of the second insulating film substantially identical.

In this case, the sentence ""with substantially the same thickness as" means that they are identical within a tolerance of ±5%. Note that it is further preferable that they match within a tolerance of ±3%. It is further preferable that the high-dielectric constant gate insulating film is used for the insulating film of the first field effect transistor. It is preferable that the lengths of the overlaps between the gate electrodes of said first and second field effect transistors and the source/drain diffusion zone are 20 nm or more and 5 nm or more shorter than one half of the channel length, respectively. Furthermore, it is preferable that the length of the overlap between the gate electrode of the first field effect transistor and the source/drain diffusion zone is identical to that between the gate electrode of the second field effect transistor and the source/drain diffusion zone.

Further, in order to achieve the above-mentioned objectives, the semiconductor of the present invention is so structured that the first and second field effect transistors are disposed on the substrate, wherein the first field effect transistor is a replacement gate type of field effect transistor and the length of the overlap between the gate electrode of the first field effect transistor and the source/drain diffusion zone is identical to that between the gate electrode of the second field effect transistor and the source/drain diffusion zone.

Further, in order to achieve the above-mentioned objectives, the semiconductor of the present invention is so structured that the first and second field effect transistors are disposed on the substrate, wherein the first insulating film is deposited on the sidewall of the gate electrode of the first field effect transistor and is connected to the gate insulating film, and made of the same material as that for the gate insulating film, and the length of the overlap between the gate electrode of the first field effect transistor and the source/drain diffusion zone is identical to that between the gate electrode of the second field effect transistor and the source/drain diffusion zone.

Further, in order to achieve the above-mentioned other objectives, the method for manufacturing the semiconductor of the present invention comprises;

a step, in which a dummy gate electrode is formed in the area on the substrate, where the gate electrode is formed, a step, in which a source and a drain are formed using the dummy gate electrode as a mask, a step, in which a first sidewall spacer is formed on the sidewall of the dummy gate electrode and a second sidewall spacer is formed on the sidewall of the first sidewall spacer, a step, in which an interlayer dielectric covering the dummy gate electrode is deposited on the semiconductor substrate, a step, in which the top surface of the interlayer dielectric is smoothed, a step, in which the top surface of the dummy gate electrode is exposed, a step, in which the dummy electrode and the first sidewall spacer are removed to form a groove having a sidewall of the second sidewall spacer and a bottom of the semiconductor substrate, a step, in which a high-dielectric constant gate insulating film with substantially the same thickness as that of the first sidewall spacer is deposited, so as to cover the bottom and sidewall of the groove on the semiconductor substrate, and a step, in which the gate electrode is embedded in the groove.

It is preferable that the material for the dummy gate electrode is identical to that for the first sidewall spacer.

Further, in order to achieve the above-mentioned other objectives, the method for manufacturing the semiconductor of the present invention comprises;

a step, in which a dummy gate electrode is formed in the area on the substrate, where the gate electrode is formed, a step, in which the first sidewall spacer is formed on the sidewall of the dummy gate electrode, a step, in which a source and a drain are formed using the dummy gate electrode and the first sidewall electrode as masks, a step, in which the second sidewall spacer is formed on the first sidewall spacer and a third sidewall spacer is formed on the second sidewall pacer, a step, in which the interlayer dielectric covering the dummy gate electrode is deposited on the semiconductor substrate, a step, in which the top surface of the interlayer dielectric is smoothed, a step, in which the top surface of the dummy gate electrode is exposed, a step, in which the dummy electrode and the first and second sidewall spacers are removed to form a groove having a sidewall of the second sidewall spacer, a step, in which a fourth sidewall spacer is formed on the sidewall of the third sidewall spacer, a step, in which a portion of the semiconductor between the fourth sidewall spacer and its adjacent sidewall spacers is exposed, a step, in which a high-dielectric constant gate insulating film with substantially the same thickness as that of the second sidewall spacer is deposited inside the groove having a bottom of the semiconductor substrate, so as to cover the bottom and sidewall of the groove on the semiconductor substrate, and a step, in which the gate electrode is embedded in the groove.

It is preferable that the thickness of the first sidewall spacer film is substantially identical to that of the fourth sidewall spacer. Further, it is preferable that the material for the dummy gate electrode is the same as those for the first and second sidewall spacers.

Further, in order to achieve the above-mentioned other objectives, the method of the semiconductor of the present invention comprises;

a step, in which a dummy gate electrode is formed in the area on the substrate, where the gate electrode is formed, a step, in which a source and a drain are formed using the dummy gate electrode as a mask, a step, in which a sidewall spacer is formed on the sidewall of the dummy gate electrode, a step, in which an interlayer dielectric covering the dummy gate electrode is deposited on the semiconductor substrate, a step, in which the top surface of the interlayer dielectric is smoothed, a step, in which the top surface of the dummy gate electrode is exposed, a step, in which the dummy electrode is removed.

a step, in which a portion of the sidewall of the sidewall spacer is scraped off, a step, in which a portion of the semiconductor substrate between the sidewall spacers is exposed to form the groove having a side wall of a sidewall spacer and a bottom of said semiconductor substrate, a step, in which a high-dielectric constant gate insulating film with substantially the same thickness as that of the sidewall spacer, of which the portion was scraped off in said step for scraping off the portion of the sidewall of said sidewall spacer, is deposited, so as to cover the bottom and sidewall of the groove on the semiconductor substrate, and a step, in which the gate electrode is embedded in the groove.

Further, in order to achieve the above-mentioned other objectives, the method of the semiconductor of the present invention comprises;

a step, in which a dummy gate electrode is formed in the area on the substrate, where the gate electrode is formed, a step, in which a source and a drain are formed using the dummy gate electrode as a mask, a step, in which a first sidewall spacer is formed on the sidewall of the dummy gate electrode, a step, in which an interlayer dielectric covering the dummy gate electrode is deposited on the semiconductor substrate, a step, in which the top surface of the interlayer dielectric is smoothed, the top surface of the dummy gate electrode is exposed, and then upper portions of the first and second sidewall spacers are scraped off, a step, in which the dummy gate electrode and the first sidewall spacer are removed to form a groove having a sidewall of the second sidewall spacer and bottom of the semiconductor substrate, a step, in which a high-dielectric constant gate insulating film with substantially the same thickness as that of the first sidewall spacer is deposited, so as to cover the bottom and sidewall of the groove on the semiconductor substrate, and a step, in which the gate electrode is embedded in the groove.

Further, in order to achieve the above-mentioned other objectives, the method for manufacturing the semiconductor of the present invention comprises;

a step, in which a dummy gate electrode is formed in the area on the substrate, where the gate electrode is formed, a step, in which a source and a drain are formed by performing ion implantation at an angle using the dummy gate electrode as a mask, a step, in which the first sidewall spacer is formed on the sidewall of the dummy gate electrode, a step, in which the interlayer dielectric covering the dummy gate electrode is deposited on the semiconductor substrate, a step, in which the top surface of the interlayer dielectric is smoothed, a step, in which the top surface of the dummy gate electrode is exposed, a step, in which the dummy electrode is removed to form the groove having a sidewall of the first sidewall spacer and a bottom of the semiconductor substrate, a step, in which a high-dielectric constant gate insulating film with substantially the same thickness as that of the first sidewall spacer is deposited, so as to cover the bottom and sidewall of the groove on the semiconductor substrate, and a step, in which the gate electrode is embedded in the groove.

It is preferable that said ion plantation is performed at any angle ranging from the normal line to the semiconductor substrate to 10–20 degrees.

In said method for manufacturing the semiconductor, the sentence "with substantially the same thickness as" always means that they are identical within a tolerance of ±5%. Note that it is further preferable that they match within a tolerance of ±3%. It is preferable that the length of the overlap between the gate electrode embedded and the source/drain diffusion zone is 20 nm or more and 5 nm or more shorter than one half of the channel length.

Further, in order to achieve the above-mentioned other objectives, the method for manufacturing the semiconductor of the present invention comprises;

a step, in which a dummy gate electrode is formed in the area of a first conductive region on the substrate, where the first gate electrode is formed, and the second gate electrode is formed in the first conductive region, a step, in which a source and a drain are formed using the dummy gate electrode and the second gate electrode as masks, a step, in which the first sidewall spacers are formed on the sidewalls of the dummy gate electrode and the second gate electrode and the second sidewall spacer is formed on the sidewall of the first sidewall spacer, a step, in which the interlayer dielectric covering the dummy gate electrode and the second gate electrode is deposited on the semiconductor substrate, a step, in which the top surface of the interlayer dielectric is smoothed, a step, in which the top surface of the dummy gate electrode is exposed, a step, in which the dummy gate electrode and said first sidewall spacer on the sidewall of the dummy gate electrode are removed to form the groove having a sidewall of the second sidewall spacer and a bottom of the semiconductor substrate, a step, in which a high-dielectric constant gate insulating film with substantially the same thickness as that of the first sidewall spacer is deposited, so as to cover the bottom and sidewall of the groove on the semiconductor substrate, and a step, in which the first gate electrode is embedded in the groove.

Further, in order to achieve the above-mentioned other objectives, the method for manufacturing the semiconductor of the present invention comprises;

a step, in which a dummy gate electrode is formed in the area of a first conductive region on the substrate, where the first gate electrode is formed, and the second gate electrode is formed in the first conductive region, a step, in which the first sidewall spacers are formed on the sidewalls of the dummy gate electrode and the second gate electrode, a step, in which a source and a drain are formed using the dummy gate electrode, the first sidewall spacer on the sidewall of the dummy gate electrode, the second dummy electrode, and the first sidewall spacer on the sidewall of the second gate electrode as masks, a step, in which the second sidewall spacers are formed on the sidewalls of the first sidewall spacer of the dummy gate electrode and of the first sidewall spacer of the second gate electrode are formed, respectively, and then the third sidewall spacers are formed on the sidewalls of the second sidewall spacers, a step, in which the interlayer dielectric covering the dummy gate electrode and the second gate electrode is deposited on the semiconductor substrate, a step, in which the top surface of the interlayer dielectric is smoothed, a step, in which the top surface of the dummy gate electrode is exposed, a step, in which the dummy electrode and the first and second sidewall spacers on the sidewall of the dummy electrode are removed, a step, in which the fourth sidewall spacer is formed on the sidewall of the third sidewall spacer on the sidewall of the dummy gate electrode, a step, in which a portion of the semiconductor substrate between the fourth sidewall spacers are exposed, a step, in which a high-dielectric constant gate insulating film with substantially the same thickness as that of the second sidewall spacer is deposited inside the groove having a sidewall of the fourth sidewall spacer and a bottom of semiconductor substrate, so as to cover the bottom and sidewall of the groove, and a step, in which the first gate electrode is embedded in the groove.

Further, in order to achieve the above-mentioned other objectives, the method for manufacturing the semiconductor of the present invention comprises;

a step, in which a dummy gate electrode is formed in the area of a first conductive region on the substrate, where the first gate electrode is formed, and the second gate electrode is formed in the first conductive region, a step, in which a source and a drain are formed using the dummy gate electrode and the second gate electrode as masks, a step, in which the sidewall spacers are formed on the sidewalls of the dummy gate electrode and the second gate electrode, respectively, a step, in which the interlayer dielectric covering the dummy gate electrode and the second gate electrode is deposited on the semiconductor substrate, a step, in which the top surface of the interlayer dielectric is smoothed, a step, in which the top surface of the dummy gate electrode is exposed, a step, in which the dummy gate electrode is removed, a step, in which a portion of the sidewall of the sidewall spacer of the dummy gate electrode is scraped off, a step, in which the portion on the semiconductor substrate between the sidewall spacers of the dummy gate electrode is exposed to form the groove having a sidewall of the sidewall spacer and a bottom of said semiconductor substrate, a step, in which a high-dielectric constant gate insulating film with substantially the same thickness as that of the sidewall spacer, of which the portion was scrapes off in the step for scraping off the portion of sidewall spacer, is deposited, so as to cover the bottom and sidewall of the groove on the semiconductor substrate, a step, in which the first gate electrode is embedded in the groove.

Further, in order to achieve the above-mentioned other objectives, the method for manufacturing the semiconductor of the present invention comprises;

a step, in which a dummy gate electrode is formed in the area of a first conductive region on the substrate, where the first gate electrode is formed, and the second gate electrode is formed in the first conductive region, a step, in which a source and a drain are formed using the dummy gate electrode and the second gate electrode as masks, a step, in which the first sidewall spacers are formed on the sidewalls of the dummy gate electrode and the second gate electrode, respectively and the second sidewall spacer is formed on the sidewall of the first sidewall spacer, a step, in which the interlayer dielectric covering the dummy gate electrode and the second gate electrode is deposited on the semiconductor substrate, a step, in which the top surface of the interlayer dielectric is smoothed and the top surface of the dummy gate electrode is exposed, and the upper portions of the first and second sidewall spacers are scraped off, a step, in which the dummy gate electrode and the first sidewall spacer are removed to form the groove having a sidewall of the second sidewall spacer and a bottom of the semiconductor substrate, a step, in which a high-dielectric constant gate insulating film with substantially the same thickness as that of the first sidewall spacer is deposited, so as to cover the bottom and sidewall of the groove on the semiconductor substrate, a step, in which the gate electrode is embedded in the groove.

Further, in order to achieve the above-mentioned other objectives, the method for manufacturing the semiconductor of the present invention comprises;

a step, in which a dummy gate electrode is formed in the area of a first conductive region on the substrate, where the first gate electrode is formed, and the second gate electrode is formed in the first conductive region, a step, in which a source and a drain are formed by performing ion implantation at an angle using the dummy gate electrode and the second gate electrode as masks, respectively, a step, in which the first sidewall spacers are formed on the sidewalls of the dummy gate electrode and the second gate electrode, respectively, a step, in which the interlayer dielectric covering the dummy gate electrode and the second gate electrode is deposited on the semiconductor substrate, a step, in which the top surface of the interlayer dielectric is smoothed, a step, in which the top surface of the dummy gate electrode is exposed, a step, in which the dummy gate electrode is removed to form the groove having a sidewall of the first sidewall spacer on the sidewall of the dummy gate electrode and a bottom of the semiconductor substrate, a step, in which a high-dielectric constant gate insulating film with substantially the same thickness as that of the first sidewall spacer is deposited, so as to cover the bottom and sidewall of the groove on the semiconductor substrate, a step, in which the first gate electrode is embedded in the groove.

In the method for manufacturing these semiconductors, the first conductive area is may be N-type region or P-type region. The sentence "with substantially the same thickness as" means that they are identical within a tolerance of ±5%. Note that it is further preferable that they match within a tolerance of ±3%. In addition, it is preferable that the lengths of the overlaps between the first gate electrode and the source/drain diffusion zone and between the second gate electrodes and the source/drain diffusion zone is 20 nm or more and 5 nm or more shorter than the length of the channel. Moreover, it is preferable that the length of the overlap between the first gate electrode and the source/drain diffusion zone is the same as that between the second gate electrode and the source/drain diffusion zone.

DETAILED DESCRIPTION OF THE PREFERRED EMBODIMENTS

Embodiment 1

Figure 6:
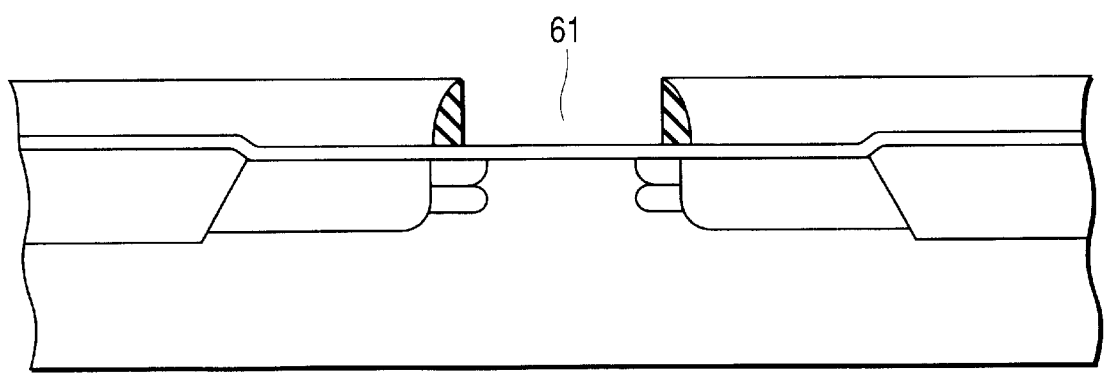
FIG. 6 is a sectional view showing the steps for manufacturing the semiconductor device according to the embodiment 1 of the present invention.
Figure 7:
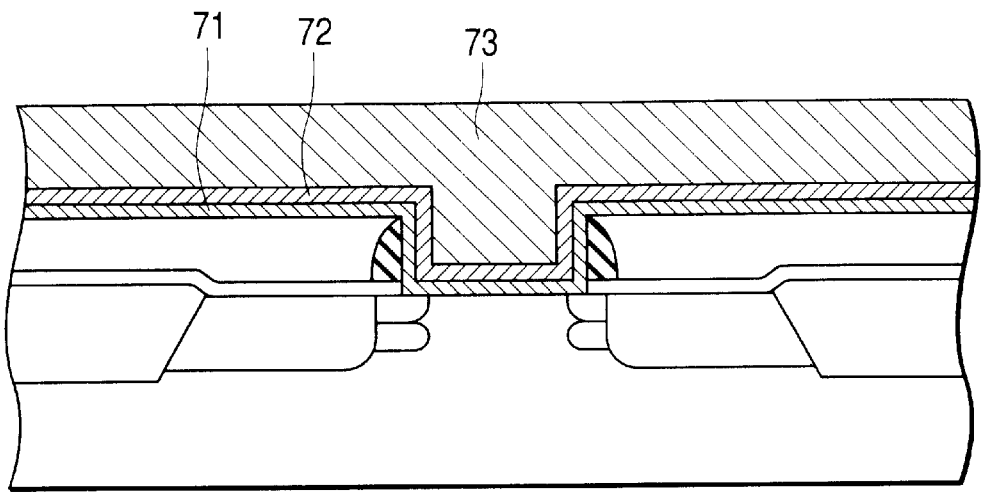
FIG. 7 is a sectional view showing the steps for manufacturing the semiconductor device according to the embodiment 1 of the present invention.
Figure 8:
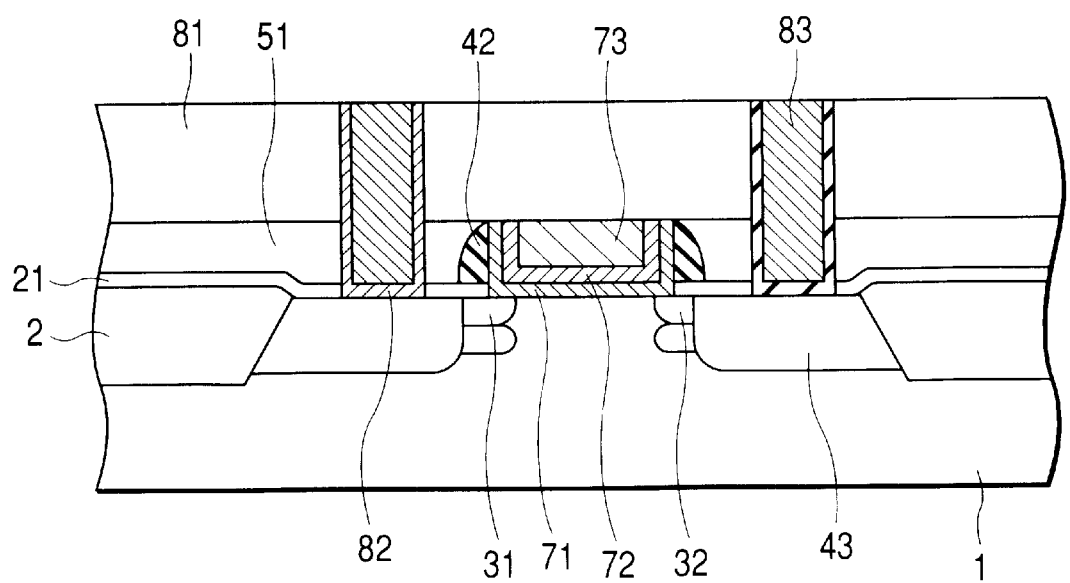
FIG. 8 is a sectional view showing the steps for manufacturing the semiconductor device according to the embodiment 1 of the present invention.

FIG. 8 is a final sectional view showing a field effect transistor according to an embodiment 1 of the present invention and FIG. 2 to FIG. 7 are schematic drawings showing the steps for manufacturing the transistor.

Figure 2:
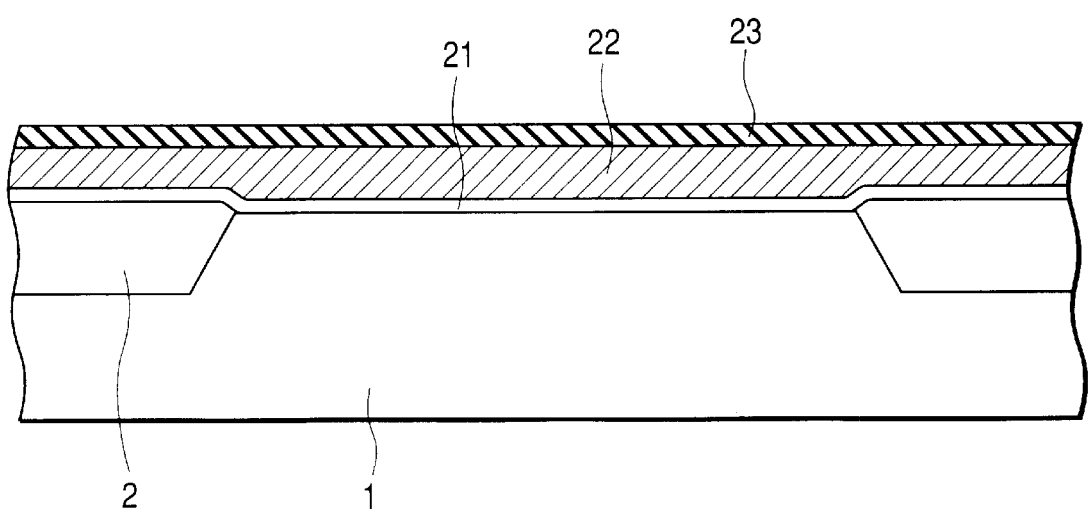
FIG. 2 is a sectional view showing the steps for manufacturing the semiconductor device according to the embodiment 1 of the present invention.

As shown in FIG. 2, after the formation of an insulation region 2 isolating between elements, which fragments an active area, on a semiconductor substrate 1 made of a piece of P-conductive type monocrystal Si with a plane direction (100) and a diameter of 20 cm, P-conductive type ion implantation and spreading heat treatment for adjusting a concentration in the semiconductor substrate, and ion implantation and activating heat treatment for adjusting a threshold voltage were performed by a known conventional method, a hot oxide film 21 with a thickness of 5 nm was deposited. Next, on said hot oxide film 21, a non-doped, amorphous Si film 22 with a thickness of 100 nm was deposited and then a silicone nitride film 23 with a thickness of 50 nm was deposited.

Figure 3:
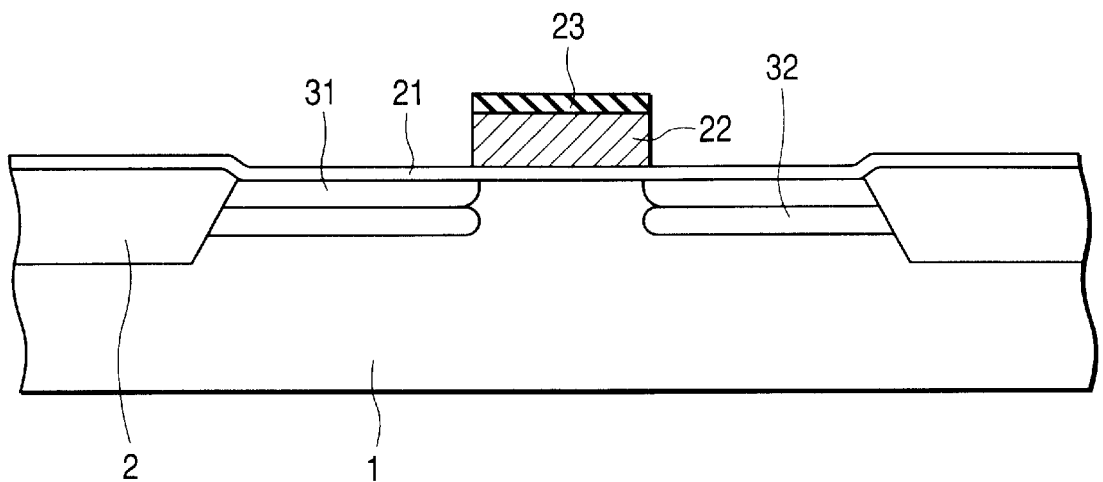
FIG. 3 is a sectional view showing the steps for manufacturing the semiconductor device according to the embodiment 1 of the present invention.

Subsequently, using known conventional lithography and etching methods, a dummy gate electrode 22 was formed as shown in FIG. 3. After the dummy gate electrode 22 was formed, As ions at a dose of $3 \times 10^{15}/cm^2$ and 3 keV of energy were implanted to form a source/drain extension 31. Next, B ions were implanted to form a P-conductive type punch-through prevention diffusion zone 32 for preventing punch-through from being occurring.

Next, a thin film of non-doped, amorphous Si with substantially the same thickness as that of a high-dielectric constant insulating film, which was to be deposited later, was deposited and etched back to form a first sidewall spacer 41 for thickening the dummy gate electrode by the thickness of the high-dielectric constant gate insulating film. In this case, it is preferable that the thickness of the non-doped, amorphous Si film is identical to that of the high-dielectric constant insulating film, which was to be deposited later, within a tolerance of ±5% and it is further preferable that they are identical within a tolerance of ±2%. This is applicable to the embodiments described below.

Figure 4:
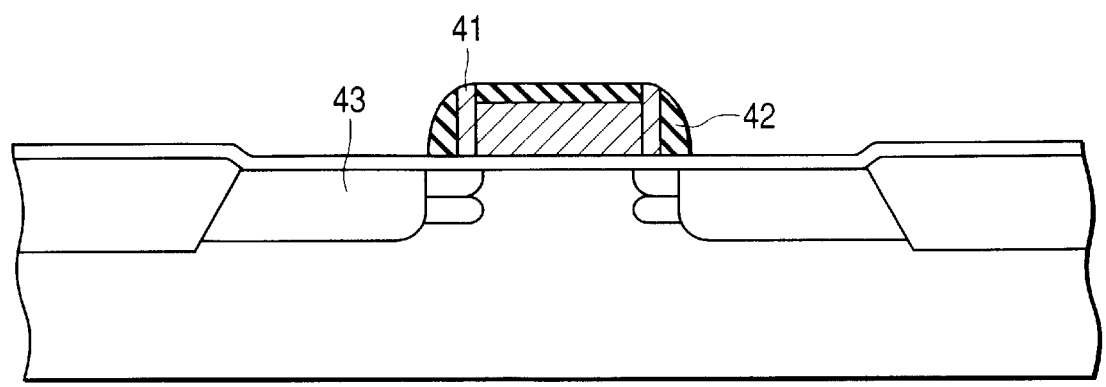
FIG. 4 is a sectional view showing the steps for manufacturing the semiconductor device according to the embodiment 1 of the present invention.
Figure 5:
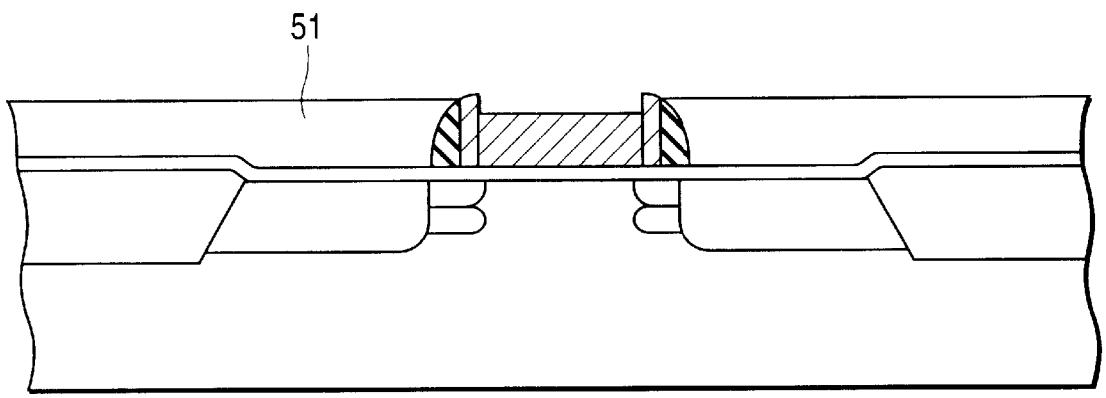
FIG. 5 is a sectional view showing the steps for manufacturing the semiconductor device according to the embodiment 1 of the present invention.

Subsequently, after a silicone nitride film was deposited on the whole surface, it was selectively left only on the sidewall of the dummy gate electrode 22 by anisotropic dry etching to form a second sidewall spacer 42. Using said second sidewall spacer 42 as an ion implantation blockage mask, ions were implanted and implanted ions were heat-treated for activation at a temperature of 1050° C. for one second to form a N-type high-concentration source/drain diffusion zone 43 (FIG. 4). Next, after a thick silicone oxide film 51 was deposited on the whole surface, its surface was smoothed by chemical-mechanical polishing. In this case, the upper surface is exposed using the silicone oxide film as a stopper and then the silicone nitride film 23 was removed by wet etching with hot phosphoric acid (FIG. 5).

Next, the dummy gate electrode 22 and the first sidewall spacer 41 were selectively removed and the exposed portion of the hot oxide film 21 was removed with diluted nitride acid to form an opening 61 (FIG. 6). At this point, it is possible that channel ions are implanted for adjusting the concentration on the substrate only at the channel part.

Next, at the opening 61, a high-dielectric constant gate insulating film 71 was deposited by chemical vapor evaporation. ZrO2 or HfO2 was used for the high-dielectric constant gate insulating film. The film was so deposited that the high-dielectric constant insulating film 71 would be in the amorphous state. In addition, the time require for deposition was so adjusted that the thickness of said high-dielectric constant insulating film would be equal to 5 nm. Next, about 10 nm of TiN 72 for the gate electrode and about 250 nm of Al electrode 73 were deposited, respectively (FIG. 7). The whole surface was smoothed by chemical-mechanical polishing and an embedded transistor structure was formed. Next, after a thick silicone oxide film 81 was deposited on the whole surface, an opening was formed in the desired region, the TiN film 82 for a diffusion barrier material and a W film 83 for a wiring metal were deposited, and the surfaces of them were smoothed by polishing to selectively leave the W film only at the opening (FIG. 8). Finally, Based on the desired circuit configuration, a metal film mainly made of aluminum was deposited and patterned to form wirings, fabricating the field effect transistor.

Thus, in the MISFET fabricated according to the present invention, the length of the overlap between a source/drain extension 31 and the gate electrode is kept at 25 nm, which is the same length as that between the source/drain extension 31 and the dummy gate electrode, and an increase in resistance and a decrease in On-current were not observed due to a reduction in overlap length.

Embodiment 2

Figure 9:
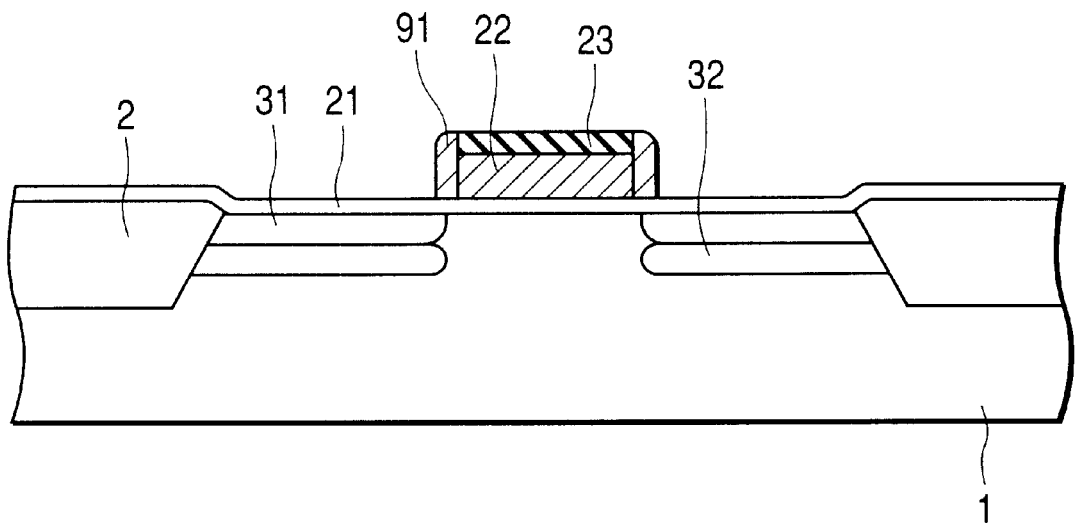
FIG. 9 is a sectional view showing the steps for manufacturing the semiconductor device according to the embodiment 2 of the present invention.
Figure 10:
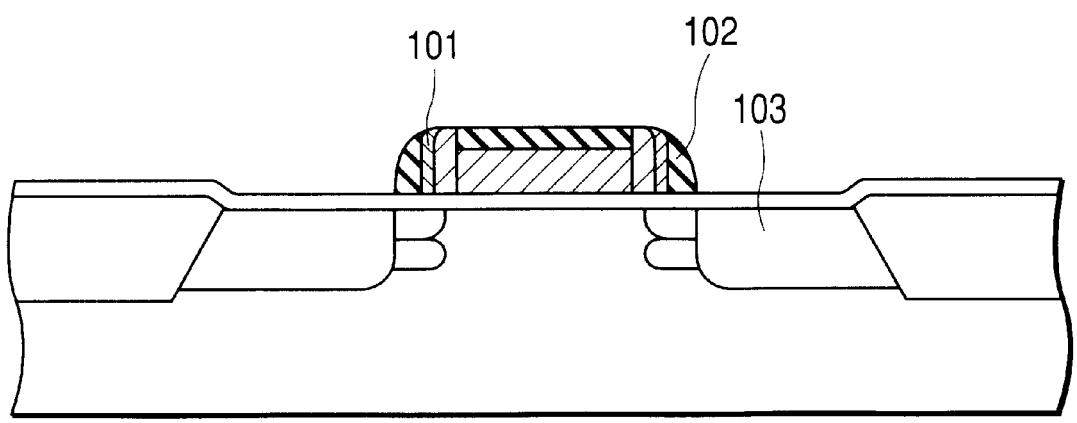
FIG. 10 is a sectional view showing the steps for manufacturing the semiconductor device according to the embodiment 2 device of the present invention.
Figure 11:
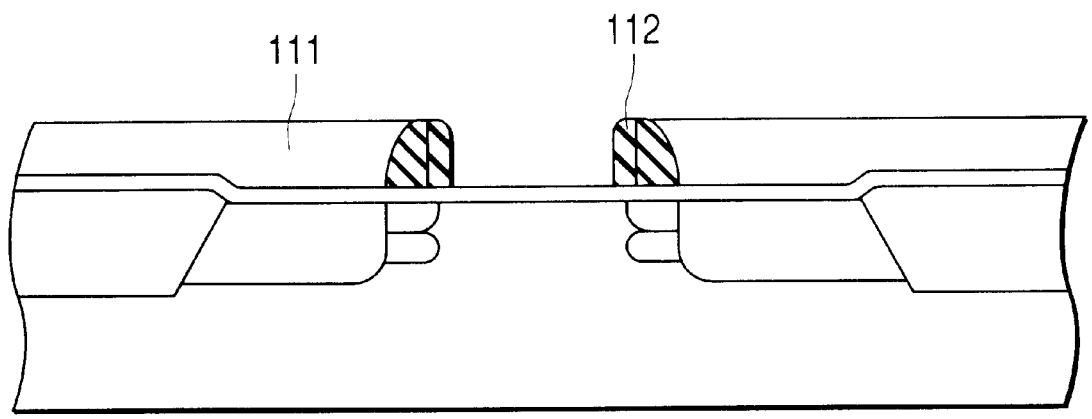
FIG. 11 is a sectional view showing the steps for manufacturing the semiconductor device according to the embodiment 2 of the present invention.
Figure 12:
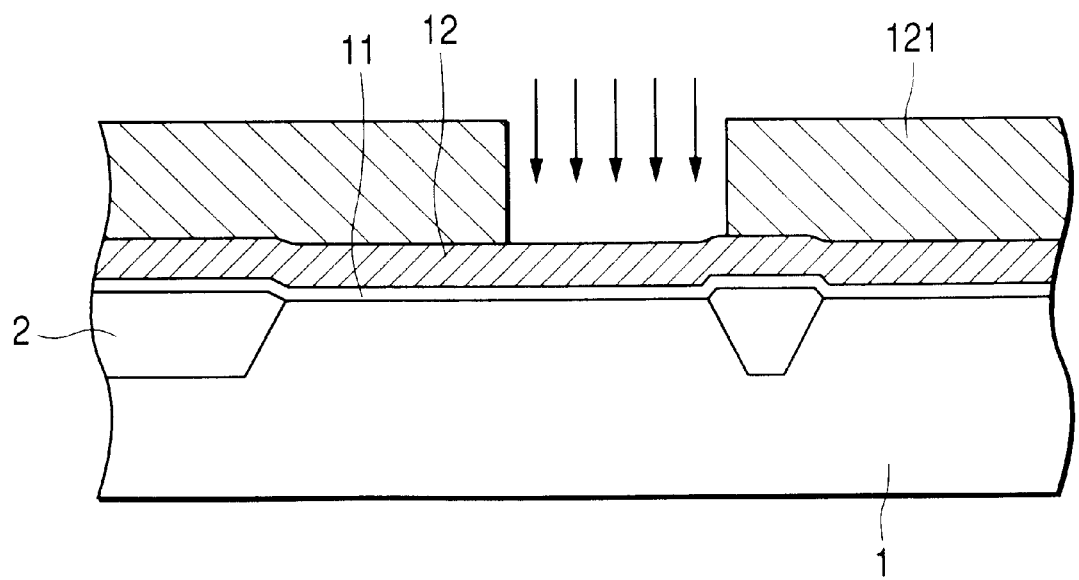
FIG. 12 is a sectional view showing the steps for manufacturing the semiconductor device according to the embodiment 3 of the present invention.

The steps for manufacturing the field effect transistor according to the embodiment 2 of the present invention are described based on FIG. 9–FIG. 11. This embodiment is useful when it is desired that the overlap length is adjusted because the source/drain extension overlaps the length of the transistor gate excessively than needed. For this embodiment, such an example is given that for a transistor with a channel length of 80 nm, the overlap length is desirably 10 nm reduced.

First, after the formation of an insulation region 2 isolating between elements, which fragments an active area, on a semiconductor substrate 1 made of a piece of P-conductive type monocrystal Si with a plane direction (100) and a diameter of 20 cm, P-conductive type ion implantation and spreading heat treatment for adjusting a concentration in the semiconductor substrate, and ion implantation and activating heat treatment for adjusting a threshold voltage were performed by a known conventional method, a hot oxide film 21 with a thickness of 5 nm was deposited. Next, on said hot oxide film 21, a non-doped, amorphous Si film 22 with a thickness of 100 nm was deposited and then a silicone nitride film 23 with a thickness of 50 nm was deposited. Subsequently, using known conventional lithography and etching methods, a dummy gate electrode 22 was formed.

Next, the non-doped, amorphous Si film was deposited and etched back to form the first sidewall spacer 91. In this case, the thickness of the non-doped Si film should be identical to that of an adjusted width of the overlap length. In this embodiment, 10 nm of non-doped, amorphous Si film was deposited.

As ions were implanted at a dose of $3\times10^{15}/cm^2$ and 3 keV of energy to form the source/drain extension 31. Next, B ions were implanted to form a P-conductive type punch-through prevention diffusion zone 32 for preventing punch-through from being occurring. The overlap length between the dummy gate electrode and-the source/drain extension is reduced by the thickness of the first sidewall spacer 91 by performing ion implantation using the dummy gate electrode and the first sidewall spacer 91 as masks (FIG. 9).

Next, non-doped, amorphous Si film with substantially the same thickness as that of a high-dielectric constant insulating film, which was to be deposited later, was deposited and etched back to form a second sidewall spacer 101. Subsequently, after a silicone nitride film was deposited on the whole surface, it was selectively left only on the sidewall of the dummy gate electrode 22 by anisotropic dry etching to form a third sidewall spacer 102. Using said third sidewall spacer 102 as an ion implantation blockage mask, ions were implanted and implanted ions were heat-treated for activation at a temperature of 1000° C. for ten seconds to form a N-type high-concentration source/drain diffusion zone 103 (FIG. 10).

Next, after a thick silicone oxide film 111 was deposited on the whole surface, its surface was smoothed by chemical-mechanical polishing. In this case, its upper surface is exposed using the silicone oxide film as a stopper and then the silicone nitride film 23 was removed by wet etching with hot phosphoric acid. Subsequently, the dummy gate electrode 22, the first sidewall spacer 91, and the second sidewall spacer 101 were selectively removed. Next, after the silicone nitride film with almost the same thickness as that of the first sidewall spacer was deposited on the whole surface, the fourth sidewall spacer 112 was formed by anisotropic dry etching (FIG. 11).

Next, the exposed portion of the hot oxide film 21 was removed with diluted nitride acid. At this point, it is possible that channel ions are implanted for adjusting the concentration on the substrate only at the channel part.

Subsequently, in the same manner as fir the embodiment 1, the high-dielectric constant insulating film and the gate electrode were deposited, the whole surface was smoothed by chemical-mechanical polishing, and the embedded transistor structure was formed. Finally, based on the desired circuit configuration, the metal film mainly made of aluminum was deposited and patterned to form wirings, fabricating the field effect transistor.

Using the steps for fabrication, for the micro MISFET, a large On-current can be ensured by correctly controlling the overlap between the source/drain extension and the gate electrode and suppressing the short channel effect. The overlap length of the activating heat-treated source/drain extension according to this embodiment of the present invention, was 25 nm. If the overlap length was not adjusted using the first sidewall spacer 91, switching characteristics were deteriorated and an OFF current became large at an impurity concentration on the substrate according to this embodiment because the overlap length was 35 nm and an effective channel length was about 10 nm, whereas according to this embodiment, good switching characteristics were achieved.

Embodiment 3

Figure 1:
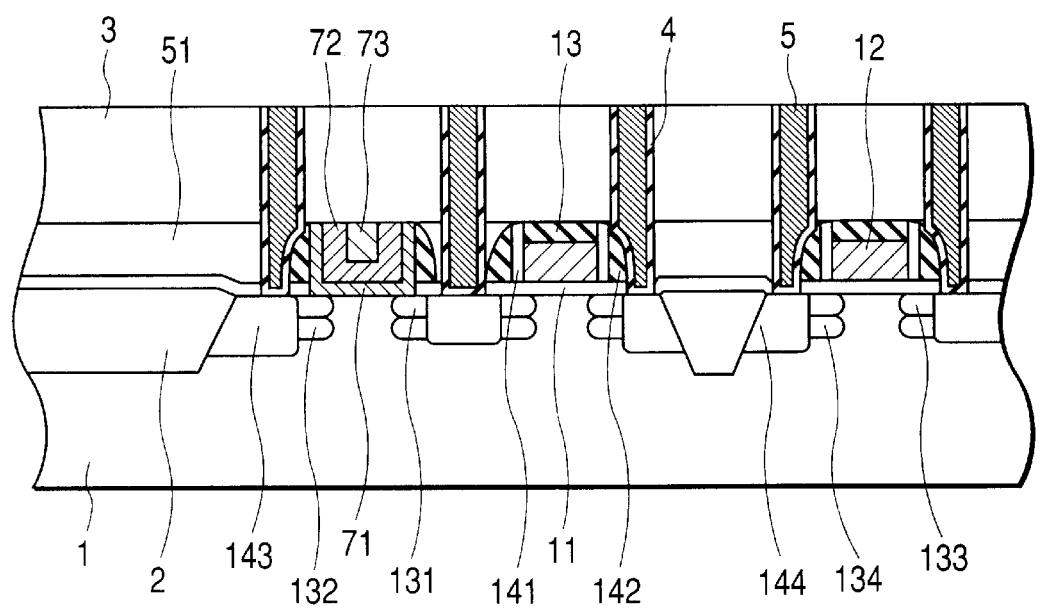
FIG. 1 is a main sectional view showing a semiconductor device according to the embodiment 3 of the present invention.

FIG. 1 is a sectional view showing the field effect transistor according to the embodiment 3 of the present invention and FIG. 12 to FIG. 17 are schematic drawings of the steps for fabricating the transistor. This embodiment is useful in manufacturing LSIs, in which a replacement gate MISFET and a conventional MOSFET are combined.

First, after the formation of an insulation region 2 isolating between elements, which fragments an active area, on a semiconductor substrate 1 made of a piece of P-conductive type monocrystal Si with a plane direction (100) and a diameter of 20 cm, P-conductive type ion implantation and spreading heat treatment for adjusting a concentration in the semiconductor substrate, and ion implantation and activating heat treatment for adjusting a threshold voltage were performed by a known conventional method, a hot oxide film 11 with a thickness of 3 nm was deposited. The hot oxide film 21 is used for a MOSFET gate oxide film having a conventional structure. Next, on said hot oxide film 11, a non-doped, amorphous Si film 12 with a thickness of 100 nm was deposited and phosphorous ions were implanted in the non-doped film 12, where the N-type MOSFET having the conventional structure using a known photolithography.

Next, after a resist was once removed, in the same manner as that above mentioned, boron ions were implanted in the non-doped Si film 12, where the P-type MOSFET having the conventional structure was to be formed was fabricated. After heat treatment was performed at a temperature of 950° C. for 60 seconds to deposit a 50 nm of silicone nitride film. Subsequently, the gate electrode was formed using known conventional lithography and etching methods.

Figure 13:
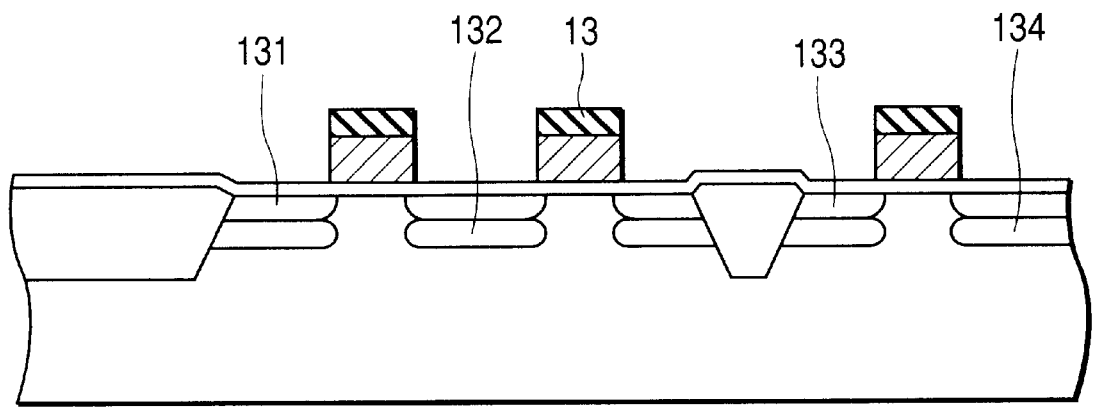
FIG. 13 is a sectional view showing the steps for manufacturing the semiconductor device according to the embodiment 3 of the present invention.

After the formation of gate electrode, As ions were implanted in the region, where a N-type MOSFET was fabricated, to form the source/drain extension 131, and then B ions were implanted to form a P-conductive type punch through prevention diffusion zone 132 for prevention punch though from occurring. Subsequently, $BF_2$ ions were implanted in the region, where a P-type MOSDFET was fabricated, to form a source/drain extension 133. Subsequently, phosphorous ions were implanted to form a N-conductive type punch-through prevention diffusion zone 134 for preventing punch-through from being occurring (FIG. 13). If impurity distributions need to be changed in the diffusion zones of the MOSFET having the conventional structure and the replacement gate MISFET, ion implantation should be performed under respective optimum conditions by photolithography.

Figure 14:
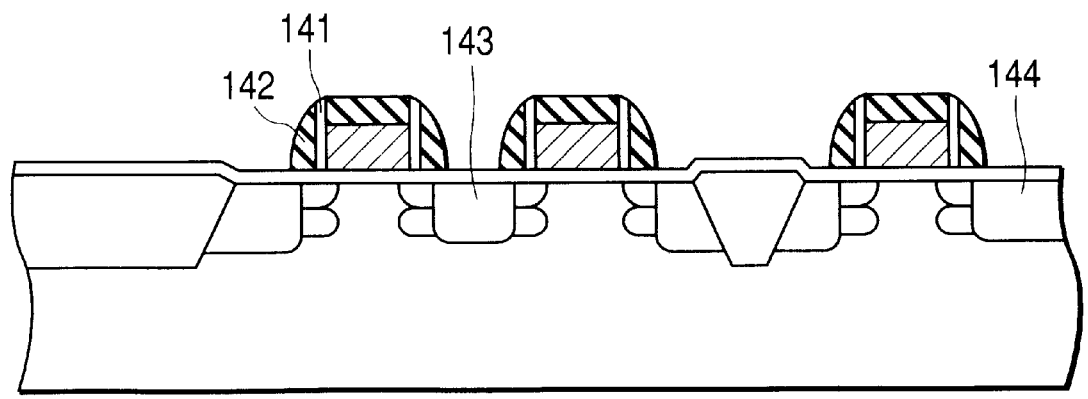
FIG. 14 is a sectional view showing the steps for manufacturing the semiconductor device according to the embodiment 3 of the present invention.

Next, the silicone oxide film with the same thickness as that of a high-dielectric constant insulating film was deposited and etched back to form a first sidewall spacer 141. Subsequently, after a silicone nitride film was deposited on the whole surface, it was selectively left only on the sidewall of the gate electrode by anisotropic dry etching to form a second sidewall spacer 142. Ions were implanted in the N-type high concentration source/drain diffusion zone 143 and the P-type high concentration diffusion zone 144 and implanted ions were heat-treated for activation at a temperature of 1050° C. for one second (FIG. 14).

Figure 15:
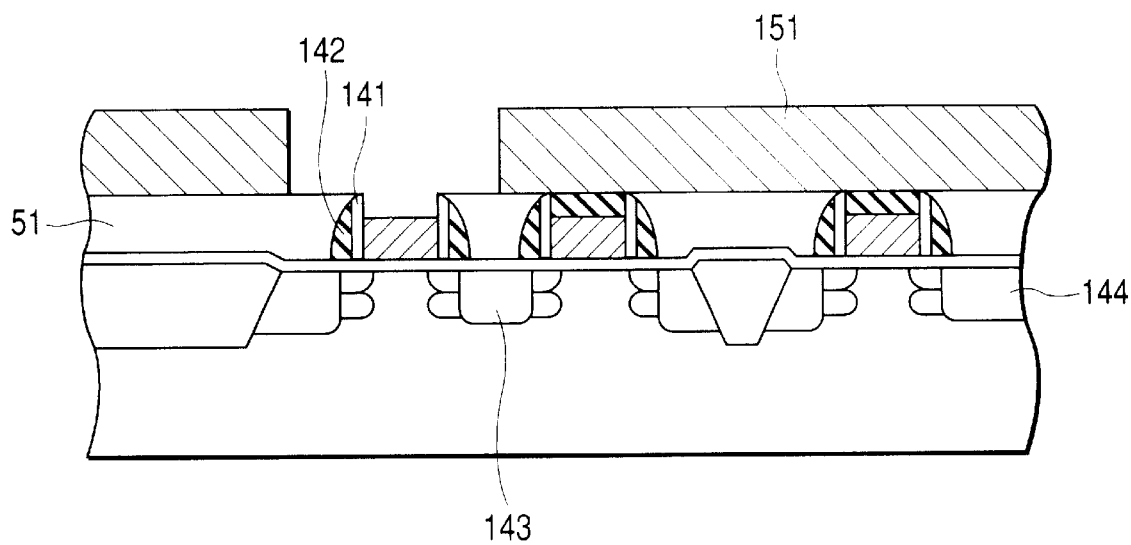
FIG. 15 is a sectional view showing the steps for manufacturing the semiconductor device according to the embodiment 3 of the present invention.

Next, after a thick silicone oxide film 51 was deposited on the whole surface, its surface was smoothed by chemical-mechanical polishing. In this case, its upper surface is exposed using the silicone oxide film 13 as a stopper. The silicone oxide film 13 in the region, where the replacement gate MISFET was to be fabricated by the known photolithography using the resist 151 as a mask, was removed by wet etching with hot phosphoric acid (FIG. 15).

Figure 16:
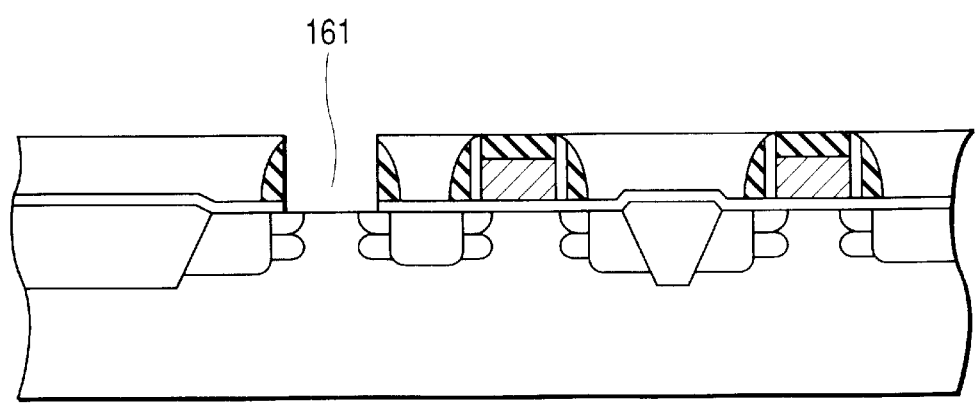
FIG. 16 is a sectional view showing the steps for manufacturing the semiconductor device according to the embodiment 3 of the present invention.
Figure 17:
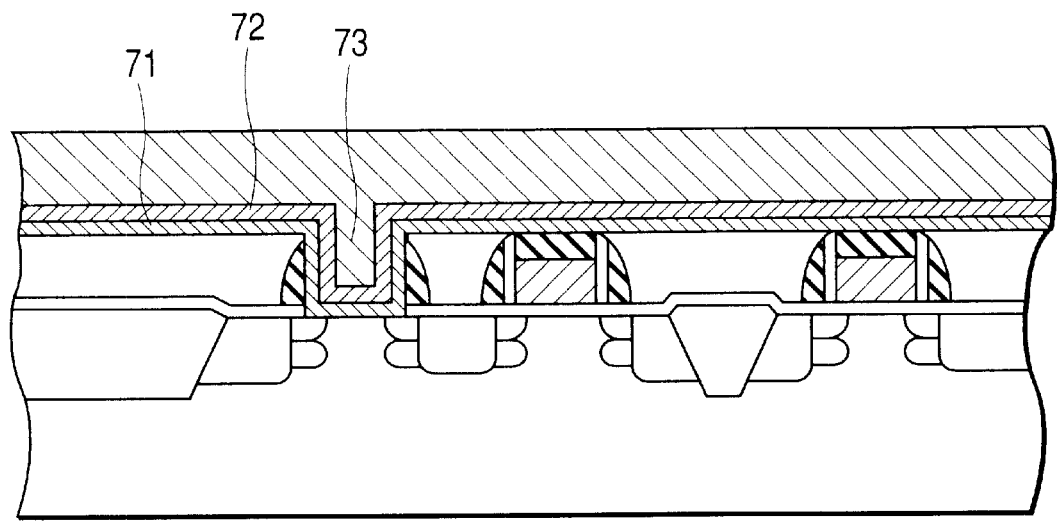
FIG. 17 is a sectional view showing the steps for manufacturing the semiconductor device according to the embodiment 3 of the present invention.

Subsequently, the dummy gate electrode was selectively removed and the exposed portion of the hot oxide film 11 was removed with diluted nitride acid to form an opening 161 (FIG. 16). The first sidewall spacer 141 was removed at the same time. At this point, it is possible that channel ions are implanted for adjusting the concentration on the substrate only at the channel part of the replacement gate MISFET. Next, the high-dielectric constant insulating film 71 was deposited by chemical vapor evaporation. ZrO2 or HfO2 was used for the high-dielectric constant insulating film 71. The high-dielectric constant insulating film 71 was so deposited that it would be in the amorphous state. The time required for deposition was so adjusted that the thickness of the high-dielectric constant film 71 would be 5 nm. Subsequently, about 10 nm of TiN72 for the electrode and about 250 nm of Al electrode 73 were deposited (FIG. 17). After the whole surface was smoothed by chemical-mechanical polishing and the embedded transistor structure was formed, a thick silicone oxide film 3 was deposited on the whole surface, an opening was formed in the desired region, TiN film 4 for a diffusion barrier material and a W film 5 for wiring metal were deposited, and the W film was smoothed by polishing for selectively leaving it only at the opening (FIG. 1). Finally, based on the desired circuit configuration, the metal film mainly made of aluminum was deposited and patterned to form wirings, fabricating the field effect transistor.

If the semiconductor device, in which the replacement gate MISFET and the conventional MOSFET are combined, is manufactured, such a problem occurs that no ON-current appears because the overlap between the source/drain extension of the replacement gate MISFET and the gate electrode is reduced by the thickness of the gate insulating film. For both the replacement gate MISFET and the conventional MOSFET of the semiconductor device manufactured according to the present invention, the overlap lengths between the source/drain extension and the gate electrode are about 25 nm, suggesting that the problem of an increase in resistance and a decrease in On-current due to a reduction in overlap length of the MISFET can be solved.

Embodiment 4

Figure 18:
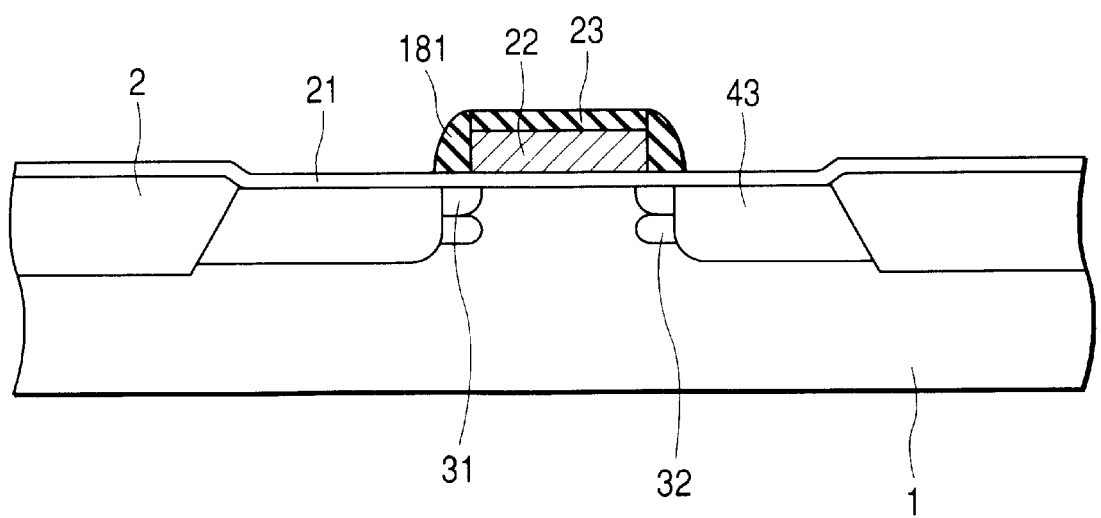
FIG. 18 is a sectional view showing the steps for manufacturing the semiconductor device according to the embodiment 4 of the present invention.
Figure 19:
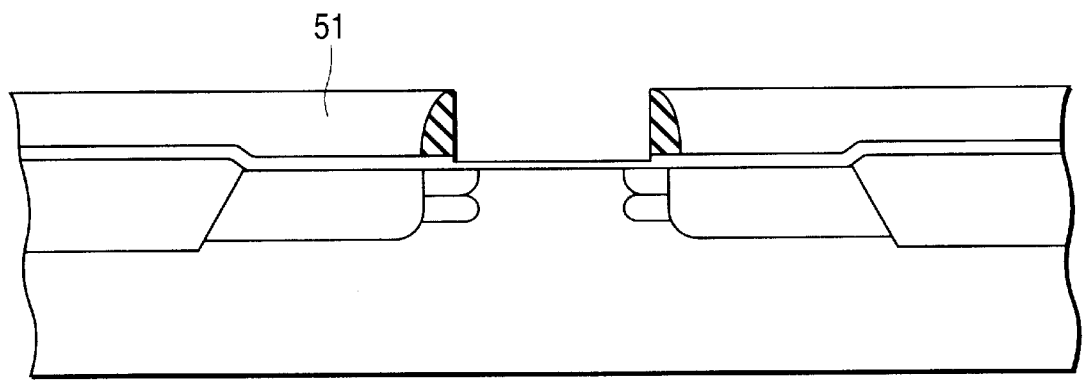
FIG. 19 is a sectional view showing the steps for manufacturing the semiconductor device according to the embodiment 4 of the present invention.

In this embodiment, the steps for manufacturing the field effect transistor by thickening the groove through etching by the thickness of the high-dielectric constant insulating film, which is another method for achieving the objectives of the present invention after removing the dummy gate are described based on FIG. 18 and FIG. 19.

The same steps as those for the embodiment 1 are followed until the structure shown in FIG. 3 is formed by implanting ions in the source/drain extension and the P-conductive type punch through prevention diffusion zone after the insulating region for isolating between the elements and the dummy gate electrode are formed.

Next, after the silicone nitride film was deposited on the whole surface, it was selectively left only on the sidewall of the dummy gate electrode by anisotropic dry etching to form an insulating film 181 on the sidewall of the dummy gate. Using said insulating film 181 on the sidewall of the dummy gate as the ion implantation blockage mask, the N-type high concentration source/drain diffusion zone 43 was formed and then is was heat-treated for activating implanted ions at a temperature of 1000° C. for 10 seconds (FIG. 18).

Next, after the thick deposited silicone oxide film 51 was deposited on the whole surface, its surface was smoothed by chemical-mechanical polishing. After using the silicone nitride film 23 as a stopper, its top surface was exposed, the silicone nitride film 23 was removed by wet etching with hot phosphorous acid and then the dummy gate electrode 22 was selectively removed.

At this point, the opening was widened by applying anisotropic dry etching to the insulating film 181 on the sidewall of the dummy gate by the thickness of the high-dielectric constant gate insulating film, which was to be deposited later. In this embodiment, 10% of mixed $CF_4/O_2$ gas was used for 5 nm etching at a rate of 20 nm/minute. In this step, the deposited silicone oxide film 51 and the hot oxide film 21 were scraped off by about 1 nm (FIG. 19).

Next, the exposed portion of the hot oxide film 21 was removed with dilute nitride acid. At this point, it is possible that channel ions are implanted for adjusting the concentration in the substrate only at the channel part.

Subsequently, the high-dielectric constant insulating film and the gate electrode were deposited in the same manner as that for the embodiment 1 and the whole surface was smoothed by chemical-mechanical polishing to form the embedded transistor structure.

Using the steps above-mentioned, the overlap between the source/drain extension and the gate electrode can be kept at 25 nm, which is the same as that between the source/drain extension and the dummy gate electrode, to prevent an increase in resistance and a decrease in ON-current due to a reduction in overlap length without using the dummy gate sidewall.

Embodiment 5

Figure 20:
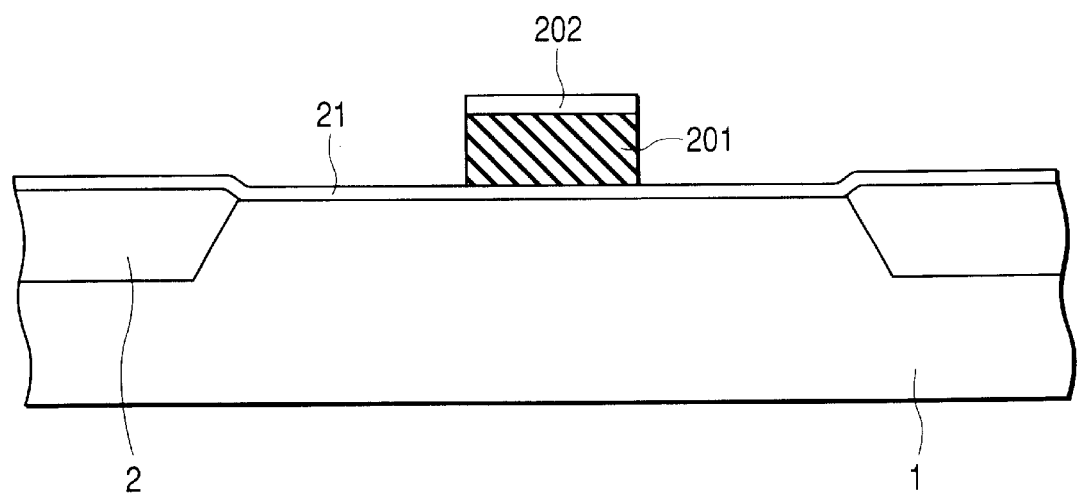
FIG. 20 is a sectional view showing the steps for manufacturing the semiconductor device according to the embodiment 5 of the present invention.
Figure 21:
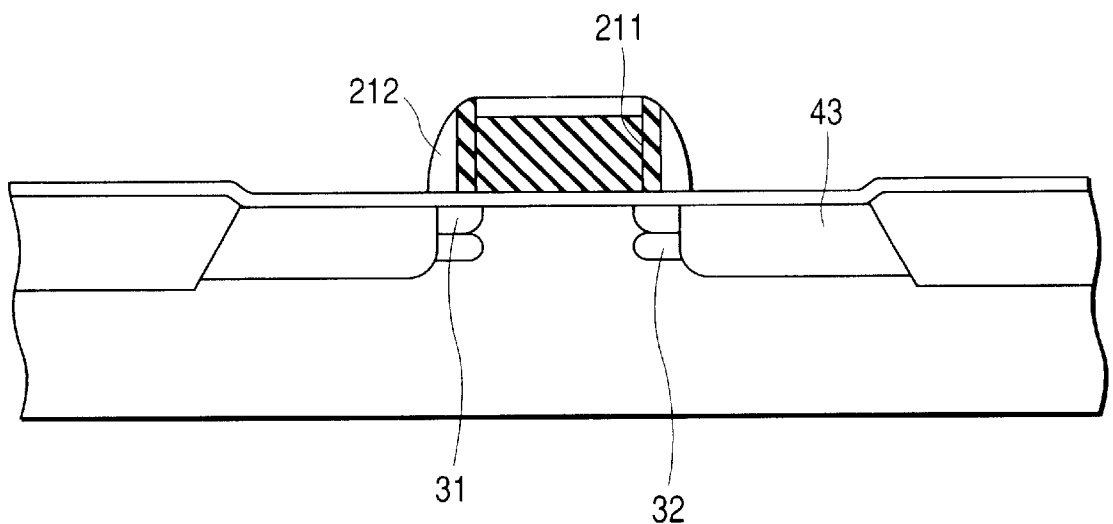
FIG. 21 is a sectional view showing the steps for manufacturing the semiconductor device according to the embodiment 5 of the present invention.
Figure 22:
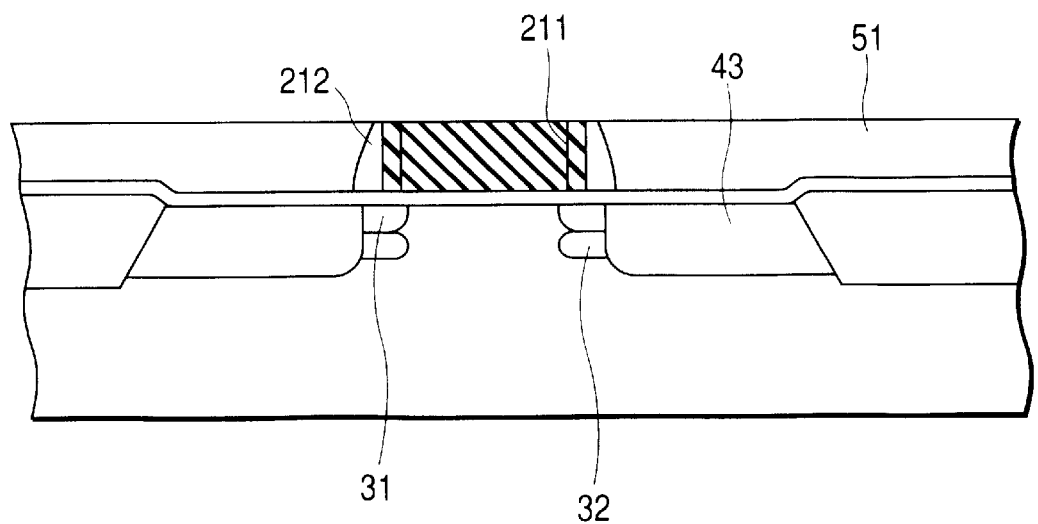
FIG. 22 is a sectional view showing the steps for manufacturing the semiconductor device according to the embodiment 5 of the present invention.
Figure 23:
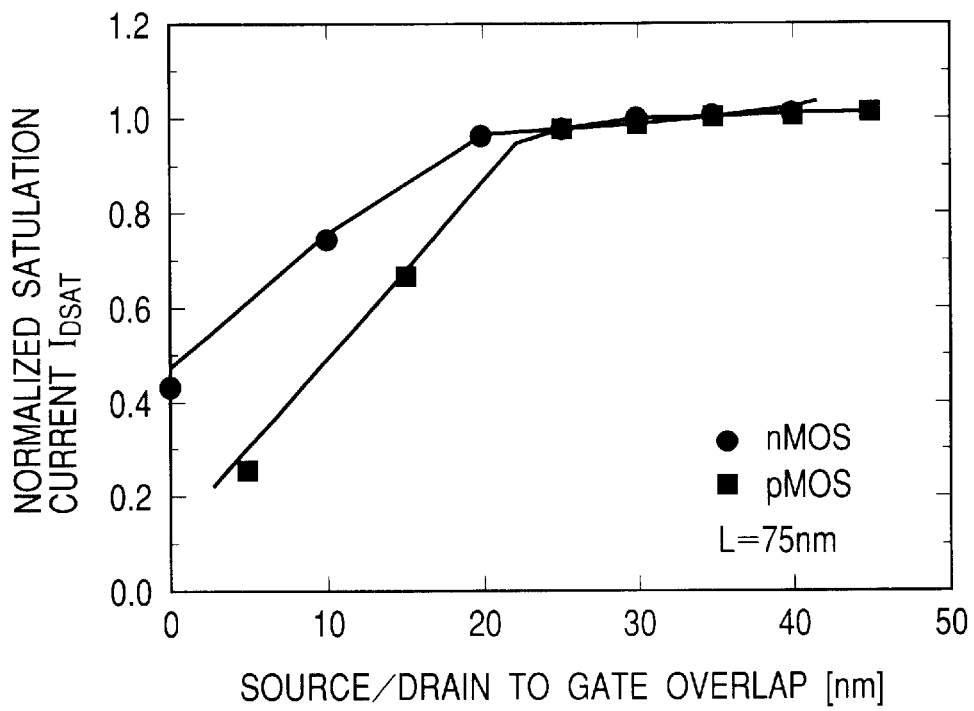
FIG. 23 is a drawing explaining the dependency of a source/drain diffusion zone for drain current and a gate electrode on an overlap length.
Figure 24:
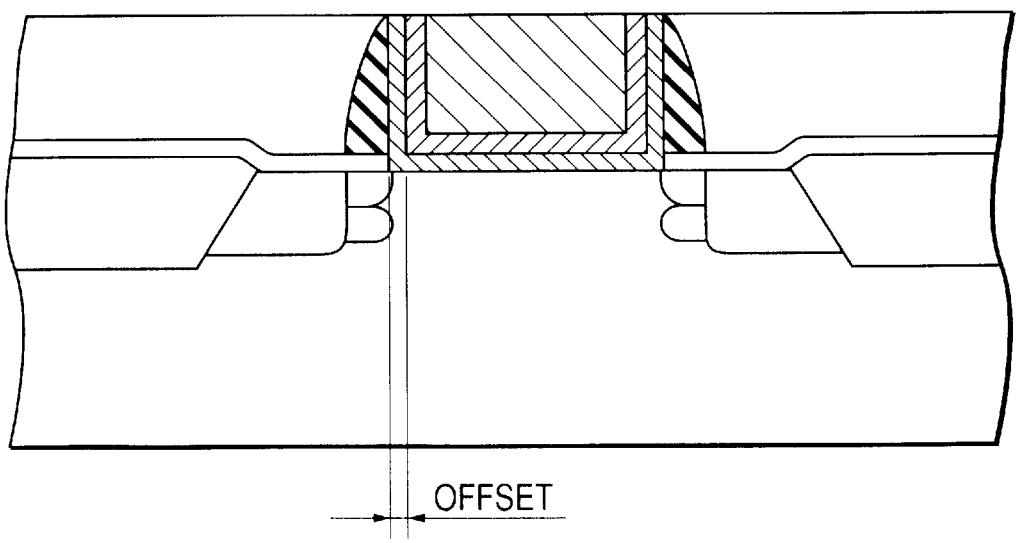
FIG. 24 is a main sectional view showing the semiconductor device for explaining a conventional example.

The steps for manufacturing the field effect transistor according to the embodiment 5 of the present invention are described based on FIG. 20–FIG. 22. In the above-mentioned embodiments, amorphous silicone was used for the dummy gate material while in this embodiment, the number of steps was reduced using a silicone oxide film, instead.

After the formation of an insulation region 2 isolating between elements, which fragments an active area, on a semiconductor substrate 1 made of a piece of P-conductive type monocrystal Si with a plane direction (100) and a diameter of 20 cm, P-conductive type ion implantation and spreading heat treatment for adjusting a concentration in the semiconductor substrate, and ion implantation and activating heat treatment for adjusting a threshold voltage were performed by a known conventional method, a hot oxide film 21 with a thickness of 5 nm was deposited. Next, on said hot oxide film 21, a silicone oxide film 201 with a thickness of 150 nm was deposited and then a silicone oxide film 202 with a thickness of 50 nm was deposited. Subsequently, using known conventional lithography and etching methods, a dummy gate electrode was formed as shown in FIG. 3.

After the dummy gate electrode was formed, As ions at a dose of $3\times10^{15}/cm^2$ and 3 keV of energy were implanted to form a source/drain extension 31. Next, B ions were implanted to form a P-conductive type punch-through prevention diffusion zone 32 for preventing punch-through from being occurring. Next, a thin film of silicone nitride with substantially the same thickness as that of a high-dielectric constant insulating film, which was to be deposited later, was deposited and etched back to form a first sidewall spacer 211. Subsequently, after a silicone oxide film was deposited on the whole surface, it was selectively left only on the sidewall of the dummy gate electrode by anisotropic dry etching to form a second sidewall spacer 212. Using said second sidewall spacer 212 as an ion implantation blockage mask, ions were implanted and implanted ions were heat-treated for activation at a temperature of 1050° C. for one second to form a N-type high-concentration source/drain diffusion zone 43 (FIG. 21).

Next, after a thick silicone oxide film 51 was deposited on the whole surface, its surface was smoothed by chemical-mechanical polishing and its top surface of the dummy gate electrode was exposed. In this case, although the material used for the first sidewall spacer 211 is a silicone nitride film, polishing would be performed until the silicone oxide film 201 of the dummy gate electrode is reached because the area of the nitride film is small (FIG. 22). In the above-mentioned embodiments, since the opening 61 is overhung because of being disposed on the shoulder of the sidewall spacer, it may affect the step for embedding the high-dielectric constant insulating film while in this embodiment, the opening 61 will not be overhung because the shoulder of the sidewall spacer is completely removed.

Next, the silicone oxide film 201 and the first sidewall spacer 211 were removed by wet-etching with hot phosphorous acid and the exposed portion of the hot oxide film 21 was removed dilute nitride acid to form the opening. At this point, it is possible that channel ions are implanted for adjusting the concentration in the substrate only at the channel part.

Subsequently, the high-dielectric constant insulating film and the gate electrode were deposited in the same manner as that for the embodiment 1 and the whole surface was smoothed by chemical-mechanical polishing to form the embedded transistor structure. Finally, based on the desired circuit configuration, a metal film mainly made of aluminum is deposited and patterned for wiring to form the field effect transistor.

Using the steps above-mentioned, the number of times wet-etching is applied can be reduced by one and such a problem can be prevented from occurring that the overhung opening formed by removing the dummy gate electrode may affect the step for embedding the high-dielectric constant insulating film.

Embodiment 6

Figure 25:
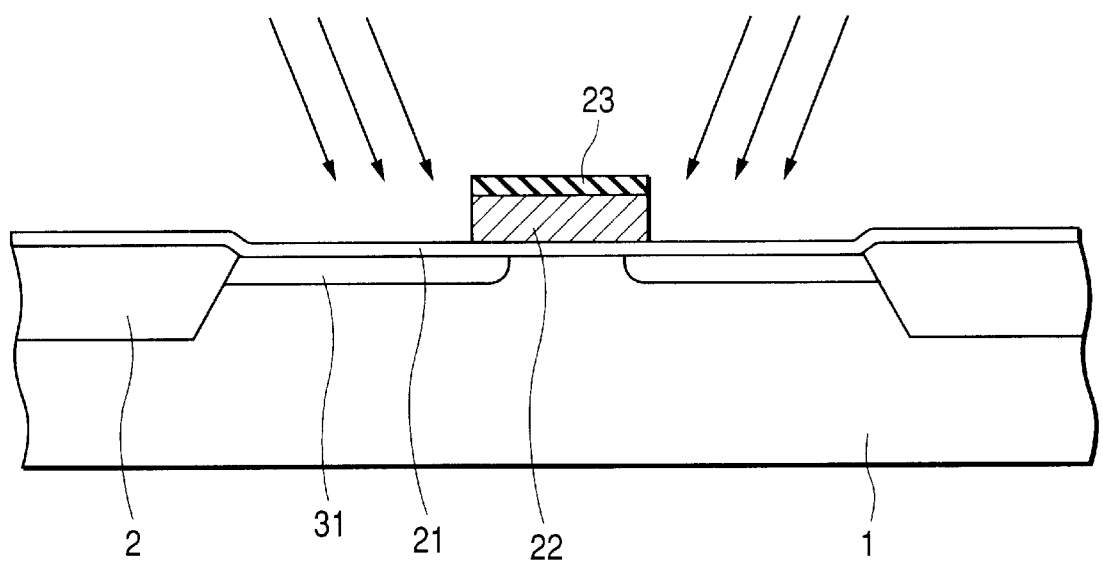
FIG. 25 is a sectional view showing the steps for manufacturing the semiconductor device according to the embodiment 6 of the present invention.
Figure 26:
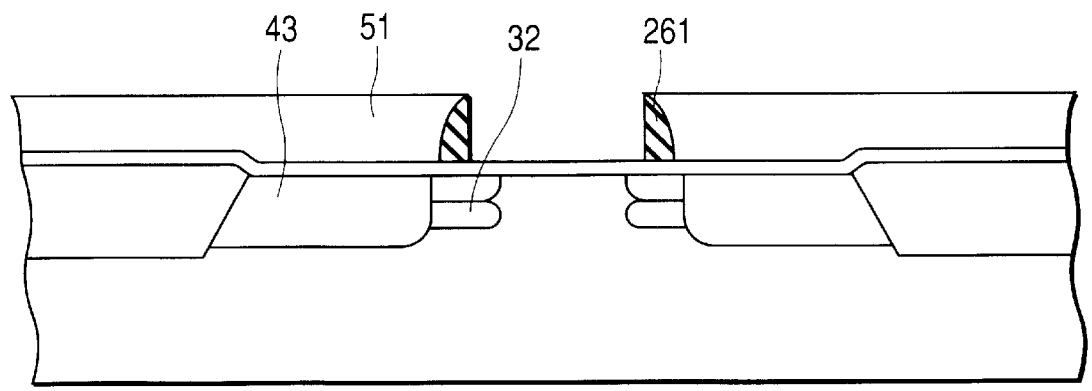
FIG. 26 is a sectional view showing the steps for manufacturing the semiconductor device according to the embodiment 6 of the present invention.

In this embodiment, another method for achieving the objectives of the present invention is described based on FIG. 25 and FIG. 26. The same steps as those for the embodiment 1 are followed until the insulating region 2 between the elements, the dummy gate electrode 22, and the silicone nitride film 23 are formed. At this point, the overlap length between the dummy gate electrode and the source/drain extension 31 is enlarged by performing ion implantation at an angle. According to the discussion by the inventor et al., Ion implantation at an angle ranging from the normal line to the substrate to 10 to 20 degrees can make the overlap length 5 nm larger than ion implantation in the direction normal to the substrate (FIG. 25).

Subsequently, ions were implanted in the O-conductive type punch through prevention layer 32. Next, after the silicone nitride film was deposited on the whole surface, it was selectively left only on the sidewall of the dummy electrode by anisotoropic dry etching to form the insulating film 261 on the sidewall of the dummy gate.

Next, Using said insulating film 261 on the sidewall of the dummy gate as the ion implantation blockage mask, the N-type high concentration source/drain diffusion zone 43 was formed and then it was heat-treated for activating implanted ions at a temperature of 1000° C. for 10 seconds. Next, after the thick silicone film 51 was deposited on the whole surface, its surface was smoothed by chemical-mechanical polishing. After using the silicone nitride film 23 as a stopper, its top surface of the dummy gate electrode 22 was exposed, the silicone nitride film 23 was removed by wet etching with hot phosphorous acid and then the dummy gate electrode 22 was selectively removed (FIG. 26).

Next, the exposed portion of the hit oxide film 21 was removed with dilute nitride acid. At this point, it is possible that channel ions are implanted for adjusting the concentration in the substrate only at the channel part.

Subsequently, the high-dielectric constant insulating film and the gate electrode were deposited in the same manner as that for the embodiment 1 and the whole surface was smoothed by chemical-mechanical polishing to form the embedded transistor structure.

Using the steps above-mentioned, the overlap between the source/drain extension and the gate electrode can be kept at 25 nm, which is the same as that between the source/drain extension and the dummy electrode, to prevent an increase in resistance and a decrease in ON-current due to a reduction in overlap length without using the dummy gate sidewall. If this embodiment is applied to the elements, in which the transistor having the conventional structure and the replacement gate transistor are combined, as described in the embodiment 3, the ion implantation step for forming the source/drain extension should be individually performed for the transistor having the conventional structure and the replacement gate transistor by known photolithography. It is recommended that ions be implanted at an angle in the ion implantation step for forming the source/drain extension of the replacement gate transistor while ion implantation in the direction normal to the substrate is performed in the ion implantation step for the source/drain extension of the transistor having the conventional structure.

Note that the present invention is not limited to the above-mentioned embodiments. For example, although in the above-mentioned embodiments, the $ZrO_2$ film or $HfO_2$ were used for the high-dielectric constant insulating film, the materials for the high-dielectric constant insulating film are not limited to these films and metal oxides such as $Al_2O_3$, $La_2O_3$, $Pr_2O_3$, $Y_2O_3$, $Ta_2O_5$, $Nb_2O_5$, $TiO_2$, and $CeO_2$, their solid solutions, the solid solutions containing these metal oxides and $SiO_2$, and titanates such as $(BaSr) TiO_3$ and others can be used. In the above-mentioned embodiments, only N-type replacement gate MISFET was described but P-type MISFET can also manufactured in the similar steps. It goes without saying that the present invention can be applied in various modes within no derogation from its intent.

According to the present invention, in the replacement gate type MISFET, an increase in resistance and a decrease in ON-current due to a reduction in the overlap length can be prevented. Further, according to the present invention, if the replacement gate MISFET and the conventional MOSFET are combined, the overlap between the source/drain extension and the gate electrode can make the same as that between the source/drain extension and the conventional MOSFET.

What is claimed is:

1. A method for manufacturing a semiconductor device comprising the steps of:

forming a dummy gate electrode in a region on the semiconductor substrate, where a gate electrode is formed;

forming a source and a drain by using said dummy gate electrode as a mask;

forming a first sidewall spacer on the sidewall of said dummy gate electrode and forming a second sidewall spacer on the sidewall of first sidewall spacer;

forming an interlayer dielectric covering said dummy gate electrode on said semiconductor substrate;

smoothing the top surface of said interlayer dielectric;

exposing the top surface of said dummy gate electrode;

removing said dummy gate electrode and said first sidewall spacer to form a groove having a sidewall of the second sidewall spacer and a bottom of said semiconductor substrate;

depositing a high-dielectric constant gate insulating film with the same thickness as that of said first sidewall spacer, so as to cover the bottom and sidewall of said groove on said semiconductor substrate; and embedding the gate electrode in said groove.

2. A method for manufacturing a semiconductor device according to claim 1, wherein the material of said dummy gate electrode is the same as that for said first sidewall spacer.

3. A method for manufacturing a semiconductor device according to claim 1, wherein the length of the overlap between the gate electrode embedded in said groove and the source/drain is 20 nm or more and 5 nm or more shorter than one half of a channel length.

* * * * *